(12) United States Patent
Moon et al.

(10) Patent No.: US 11,270,648 B2
(45) Date of Patent: Mar. 8, 2022

(54) DISPLAY DEVICE

(71) Applicant: SAMSUNG DISPLAY CO., LTD., Yongin-si (KR)

(72) Inventors: Sung Jae Moon, Seongnam-si (KR); Dong Woo Kim, Yongin-si (KR); Kang Moon Jo, Hwaseong-si (KR); Jun Hyun Park, Suwon-si (KR); An Su Lee, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 47 days.

(21) Appl. No.: 16/817,694

(22) Filed: Mar. 13, 2020

(65) Prior Publication Data

US 2020/0302877 A1 Sep. 24, 2020

(30) Foreign Application Priority Data

Mar. 21, 2019 (KR) .................. 10-2019-0032344

(51) Int. Cl.
*G09G 3/3266* (2016.01)
*H01L 27/32* (2006.01)
*G09G 3/3291* (2016.01)

(52) U.S. Cl.
CPC ......... *G09G 3/3266* (2013.01); *G09G 3/3291* (2013.01); *H01L 27/3258* (2013.01); *H01L 27/3276* (2013.01)

(58) Field of Classification Search
CPC ............. H01L 27/3265; H01L 27/3262; H01L 27/3276; H01L 27/3258; H01L 2227/323; G09G 3/3291; G09G 3/3266
See application file for complete search history.

(56) References Cited

U.S. PATENT DOCUMENTS

| 8,638,032 | B2 | 1/2014 | Maindron et al. |
| 8,723,166 | B2 | 5/2014 | Park |
| 9,722,085 | B2 | 8/2017 | Koezuka et al. |
| 9,818,971 | B2 | 11/2017 | Cheng et al. |

(Continued)

FOREIGN PATENT DOCUMENTS

| KR | 10-2002-0026193 | 4/2002 |
| KR | 10-2015-0011868 | 2/2015 |

(Continued)

*Primary Examiner* — Christopher E Leiby

(74) *Attorney, Agent, or Firm* — F. Chau & Associates, LLC

(57) ABSTRACT

A display device includes a first conductive layer, a first insulation layer disposed on the first conductive layer, and active patterns disposed on the first insulation layer. The display device further includes a second conductive layer disposed on the active patterns and including a first gate electrode that overlaps a channel region of the active patterns and a driving gate electrode, a second insulation layer disposed on the second conductive layer, a third conductive layer including a capacitor electrode and at least one scan line disposed on the second insulation layer, a third insulation layer disposed on the third conductive layer, and an electrode layer including a first electrode disposed on the third insulation layer. The first electrode is connected to the capacitor electrode, the capacitor electrode overlaps the driving gate electrode, and the capacitor electrode and the driving gate electrode form a capacitor.

20 Claims, 11 Drawing Sheets

(56) References Cited

U.S. PATENT DOCUMENTS

| | | | |
|---|---|---|---|
| 2011/0031491 A1* | 2/2011 | Yamazaki | H01L 29/78696 |
| | | | 257/43 |
| 2012/0280236 A1 | 11/2012 | Li | |
| 2017/0098688 A1 | 4/2017 | Chang et al. | |
| 2017/0162716 A1* | 6/2017 | Koezuka | H01L 29/24 |
| 2019/0067403 A1* | 2/2019 | Song | H01L 29/78633 |
| 2019/0081126 A1* | 3/2019 | Naganuma | H01L 51/56 |
| 2020/0212077 A1* | 7/2020 | Jang | H01L 27/1225 |
| 2020/0395434 A1* | 12/2020 | Jeon | H01L 27/3248 |

FOREIGN PATENT DOCUMENTS

| | | |
|---|---|---|
| KR | 10-2016-0075966 | 6/2016 |
| KR | 10-2018-0038987 | 4/2018 |
| KR | 10-2018-0074164 | 7/2018 |

* cited by examiner

DISPLAY DEVICE

CROSS-REFERENCE TO RELATED APPLICATIONS

This application claims priority under 35 U.S.C. § 119 to Korean Patent Application No. 10-2019-0032344, filed on Mar. 21, 2019, the disclosure of which is incorporated by reference herein in its entirety.

TECHNICAL FIELD

Exemplary embodiments of the present invention relate to a display device.

Discussion of the Related Art

A light emitting diode display has a self-emissive characteristic, and unlike a liquid crystal display, does not require a separate light source. As a result, the thickness and the weight of the display can be reduced. In addition, a light emitting diode display has high-grade characteristics such as, for example, low power consumption, high luminance, and a high response speed.

In general, a light emitting diode display includes a substrate, a plurality of thin film transistors disposed on the substrate, a plurality of insulation layers disposed between wires that form the thin film transistors, and a light emitting element that is connected to the thin film transistor. The light emitting element may be, for example, an organic light emitting element.

SUMMARY

Exemplary embodiments provide a display device of which resistance of wires can be reduced and display quality can be improved.

According to an exemplary embodiment, a display device includes a substrate, a first conductive layer disposed on the substrate, a first insulation layer disposed on the first conductive layer, and a plurality of active patterns disposed on the first insulation layer. The active patterns include a source region, a channel region, and a drain region. The display device further includes a second conductive layer disposed on the active patterns and including a first gate electrode that overlaps the channel region and a driving gate electrode, a second insulation layer disposed on the second conductive layer, a third conductive layer including a capacitor electrode and at least one scan line disposed on the second insulation layer, a third insulation layer disposed on the third conductive layer, and an electrode layer including a first electrode disposed on the third insulation layer. The first electrode is connected to the capacitor electrode, the capacitor electrode overlaps the driving gate electrode, and the capacitor electrode and the driving gate electrode form a capacitor.

In an exemplary embodiment, the capacitor electrode is electrically connected to the first conductive layer.

In an exemplary embodiment, the second conductive layer further includes an overlapped gate pattern that overlaps the at least one scan line.

In an exemplary embodiment, the third insulation layer includes an organic material.

In an exemplary embodiment, the display device further includes a fourth conductive layer disposed between the third insulation layer and the electrode layer. The fourth conductive layer includes a data line, a driving voltage line, a common voltage line, an initialization voltage line, and a plurality of connection patterns.

In an exemplary embodiment, the at least one scan line includes a first scan line and a second scan line, the second conductive layer further includes a second gate electrode, and the first scan line and the second gate electrode are connected to each other by one connection pattern from among the plurality of connection patterns.

In an exemplary embodiment, the first electrode and the capacitor electrode are connected to each other through one of the plurality of connection patterns.

In an exemplary embodiment, the third conductive layer further includes a plurality of connection electrodes, the plurality of active patterns include a first active pattern, a second active pattern, and a third active pattern, and each active pattern is connected to at least one of the plurality of connection electrodes of the third conductive layer.

In an exemplary embodiment, a resistance of the third conductive layer is lower than a resistance of the second conductive layer.

According to an exemplary embodiment, a display device includes a substrate, a first conductive layer disposed on the substrate, a first insulation layer disposed on the first conductive layer, and a plurality of active patterns disposed on the first insulation layer and including a source region, a channel region, and a drain region. The display device further includes a second conductive layer disposed on the active patterns and including a plurality of data overlapped lines, a second insulation layer disposed on the second conductive layer, a third conductive layer disposed on the second insulation layer and including a plurality of data lines, a common voltage line and at least one scan line, a third insulation layer disposed on the third conductive layer, and an electrode layer including a first electrode disposed on the third insulation layer. The plurality of data lines overlap the plurality of data overlapped lines, respectively, and the at least one scan line overlaps the first conductive layer.

In an exemplary embodiment, the second conductive layer further includes a common voltage overlapped line, the common voltage line overlaps the common voltage overlapped line and the first conductive layer, and the common voltage line is electrically connected to the common voltage overlapped line and the first conductive layer.

In an exemplary embodiment, the third conductive layer further includes a driving voltage line and an initialization voltage line, the second conductive layer includes a plurality of gate patterns, and the plurality of gate patterns, the driving voltage line, and the initialization voltage line respectively overlap each other.

In an exemplary embodiment, the first conductive layer includes a plurality of lower patterns, and one of the plurality of lower patterns is disposed in a direction that crosses the common voltage line and is connected to the common voltage line.

In an exemplary embodiment, the plurality of active patterns include a first active pattern, a second active pattern, and a third active pattern, the at least one scan line includes a first scan line and a second scan line, an extending portion of the first scan line extends in a direction that is different from a remaining portion of the first scan line, and the extending portion of the first scan line overlaps the channel regions of the first active pattern and the third active pattern.

In an exemplary embodiment, an extending portion of the second scan line extends in a direction that is different from a remaining portion of the second scan line, and the extending portion of the second scan line overlaps the channel region of the second active pattern.

In an exemplary embodiment, the display device further includes a pad electrode disposed on a same layer as the third conductive layer, and a pad connection electrode disposed on a same layer as the second conductive layer. The pad electrode is electrically connected to the first conductive layer, and the pad electrode is electrically connected to the pad connection electrode.

In an exemplary embodiment, the second conductive layer further includes a driving gate electrode, and the third conductive layer further includes a capacitor that overlaps the driving gate electrode.

In an exemplary embodiment, the first conductive layer includes a plurality of lower patterns, and at least one of the plurality of lower patterns overlaps the capacitor electrode.

In an exemplary embodiment, the display device further includes a first electrode connected to the capacitor electrode.

According to an exemplary embodiment, a display device includes a substrate, a first conductive layer disposed on the substrate, and a transistor disposed on the first conductive layer and including a gate electrode and an overlapped gate electrode. The gate electrode is formed in a second conductive layer disposed on the first conductive layer, and the overlapped gate electrode is formed in a third conductive layer disposed on the second conductive layer. The display device further includes a capacitor including a driving gate electrode and a capacitor electrode, and a scan line formed in the third conductive layer. The capacitor electrode overlaps the driving gate electrode, the capacitor electrode is formed in the third conductive layer, and the driving gate electrode is formed in the second conductive layer.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
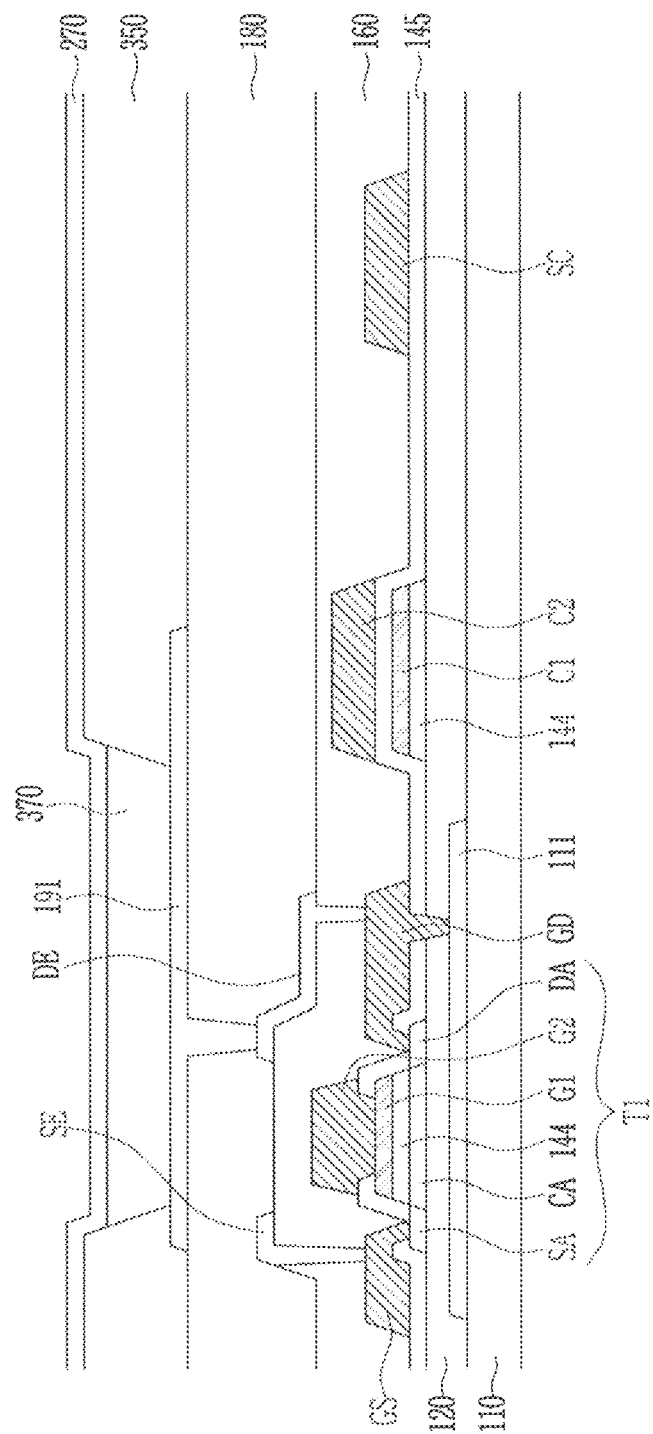
FIG. 1 is a schematic cross-sectional view of a display device according to an exemplary embodiment of the present invention.

Exemplary embodiments of the present invention will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements should be interpreted in a like fashion.

A display device according to an exemplary embodiment of the present invention will be described hereinafter with reference to the accompanying drawings.

Figure 2:
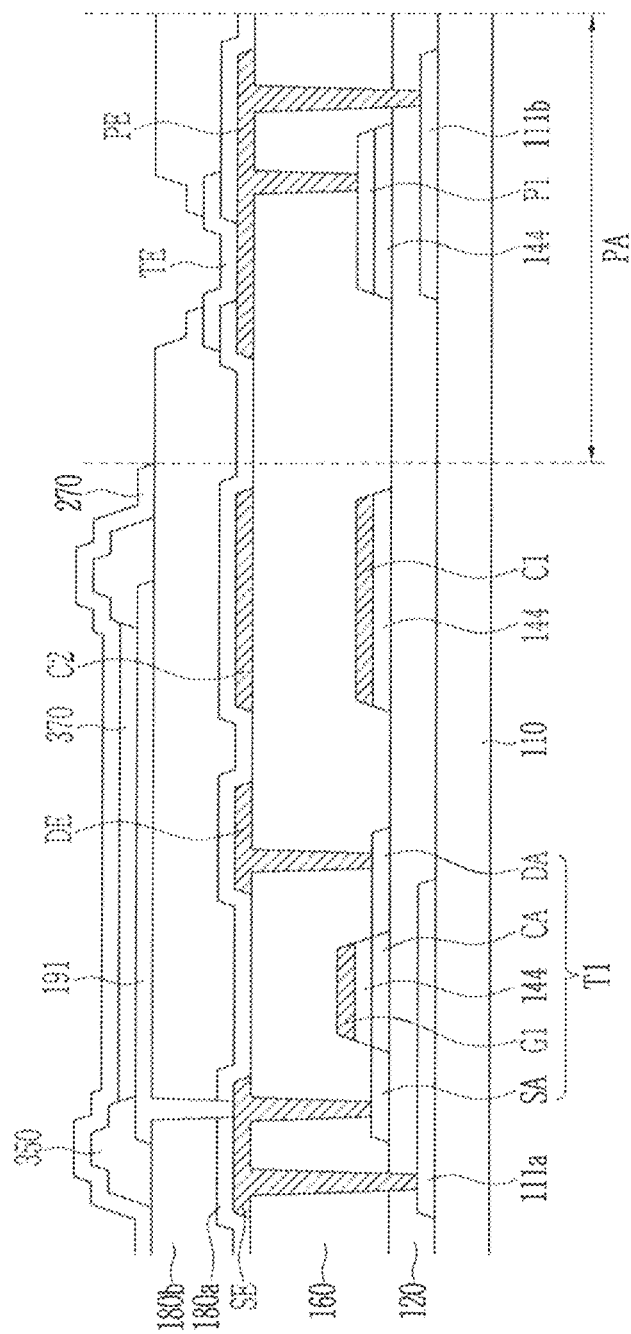
FIG. 2 is a schematic cross-sectional view of a display device according to an exemplary embodiment of the present invention.

FIGS. 1 and 2 schematically illustrate a cross-section of a display device according to exemplary embodiments of the present invention.

Referring to FIG. 1, a display device according to an exemplary embodiment of the present invention includes a lower pattern 111 formed on a substrate 110. A buffer layer 120, which is an insulation layer, is disposed on the lower pattern 111. The buffer layer 120 may also be referred to herein as an insulation layer.

An active layer that includes a source area SA, a channel area CA, and a drain area DA is disposed on the buffer layer 120. The active layer may correspond to an active pattern, the source area SA may correspond to a source region, the channel area CA may correspond to a channel region, and the drain area DA may correspond to a drain region. An insulation pattern 144 is formed on the active layer. The insulation pattern 144 may also be referred to herein as a first insulation layer. The insulation pattern 144 may overlap the channel area CA.

A second conductive layer may be disposed on the insulation pattern 144. The second conductive layer may include a first gate electrode G1 and a first capacitor electrode C1. The first capacitor electrode C1 may also be referred to herein as a driving gate electrode C1. The first gate electrode G1 may overlap the channel area CA. The first gate electrode G1 may be aligned with the channel area CA. For example, ends of the first gate electrode G1 may be aligned with ends of the channel area CA.

A second insulation layer 145 may be disposed on the second conductive layer. A third conductive layer may be disposed on the second insulation layer 145. The third conductive layer includes a first overlapped gate electrode G2 that overlaps the first gate electrode G1, a second capacitor electrode C2 that overlaps the driving gate electrode C1, and a scan line SC.

The first gate electrode G1, the first overlapped gate electrode G2, the source area SA, the channel area CA, and the drain area DA form one transistor T1.

Since the second capacitor electrode C2, which is part of the third conductive layer, overlaps the driving gate electrode C1, which is part of the second conductive layer, the second capacitor electrode C2 and the driving gate electrode C1 may together form a capacitor. According to exemplary embodiments, forming the capacitor using electrodes belonging to the second and third conductive layers, respectfully, forming the scan line SC as part of the third conductive layer, and forming the gate electrode of the transistor T1 such that it includes a multiple gate electrode structure (e.g., gate electrodes G1 and G2) spanning the second and third conductive layers, reduces resistance and the load of the display device.

In addition, the third conductive layer may include a source connection pattern GS that contacts the source area SA, and a drain connection pattern GD that contacts the drain area DA. The drain connection pattern GD may be electrically connected to the lower pattern 111 through a contact hole that is disposed in the buffer layer 120 and the second insulation layer 145. A first electrode 191 may be electrically connected to a second capacitor electrode C2 via one of the source connection patterns, and the second capacitor electrode C2 may be electrically connected to the lower pattern 111.

A third insulation layer 160 may be disposed on the third conductive layer. A fourth conductive layer may be disposed on the third insulation layer 160. The fourth conductive layer may include a source electrode SE and a drain electrode DE.

A fourth insulation layer 180 may be disposed on the fourth conductive layer. The first electrode 191 is disposed on the fourth insulation layer 180. The fourth insulation layer 180 includes a contact hole, and the first electrode 191 may be connected to the drain electrode DE through the contact hole.

A partition wall 350 may be disposed on the first electrode 191. The partition wall 350 may include an opening that overlaps the first electrode 191.

A second electrode 270 may be disposed on the partition wall 350. The second electrode 270 may overlap the first electrode 191. A light emitting element layer 370 may be disposed in an opening in the partition wall 350 between the first electrode 191 and the second electrode 270.

Referring to FIG. 1, according to an exemplary embodiment, a display device includes a second conductive layer and a third conductive layer. The second conductive layer includes the first gate electrode G1 and the first capacitor electrode C1. The third conductive layer includes the first overlapped gate electrode G2 that is electrically connected to and overlaps the first gate electrode G1, and a second capacitor electrode C2 that overlaps the driving gate electrode C1.

As a result of this configuration, a gate electrode of the transistor T1 may have reduced resistance since it includes the first gate electrode G1 and the first overlapped gate electrode G2. In addition, a capacitor of the display device is disposed between the driving gate electrode C1 and the second capacitor electrode C2.

The scan line SC of the display device is formed of the third conductive layer. Thus, the scan line SC is disposed on the same layer as the first overlapped gate electrode G2 and the second capacitor electrode C2.

In an exemplary embodiment, the second conductive layer may be a double layer of molybdenum and titanium, and the third conductive layer may be a triple layer of titanium/aluminum/titanium. The thickness of molybdenum in the second conductive layer may be, for example, between about 2000 Å and about 3000 Å, and the thickness of titanium may be, for example, between about 200 Å and about 400 Å. In addition, in the third conductive layer, the thickness of titanium may be, for example, between about 400 Å and about 800 Å, and the thickness of aluminum may be, for example, between about 5000 Å and about 7000 Å.

In this case, the third conductive layer has a lower resistance than the second conductive layer. Accordingly, the scan line SC may be formed with the third conductive layer due to this lower resistance.

In FIG. 1, the scan line SC is formed of a single layer of the third conductive layer. However, exemplary embodiments are not limited thereto. For example, in an exemplary embodiment, the scan line SC may be formed by the second conductive layer and the third conductive layer, which are electrically connected to and overlap each other. In this case, resistance of the scan line SC can be further reduced. For example, according to exemplary embodiments, the scan line SC may be formed only in the third conductive layer, or may be formed in the third conductive layer as well as in the second conductive layer.

Referring to FIG. 2, a display device according to an exemplary embodiment is similar to the exemplary embodiment of FIG. 1, except that the display device of FIG. 2 does not include the third conductive layer or the second insulation layer 145. For convenience of explanation, a further description of elements and technical aspects previously described may be omitted.

In the exemplary embodiment of FIG. 2, the lower pattern 111 includes a first lower pattern 111a that overlaps a transistor T1, and a second lower pattern 111b that is disposed in a pad portion PA.

A buffer layer 120 is disposed on the lower pattern 111. An active layer that includes a source area SA, a channel area CA, and a drain area DA is disposed on the buffer layer 120. The source area SA and the drain area DA of the active layer may be, for example, n+ doped. An insulation pattern 144 overlaps the channel area CA.

A first gate electrode G1, a first capacitor electrode C1, and a pad lower electrode P1 are disposed on the active layer.

A third insulation layer 160 is disposed on the first gate electrode G1, the first capacitor electrode C1, and the pad lower electrode P1.

A source electrode SE, a drain electrode DE, a second capacitor electrode C2, and a pad electrode PE are disposed on the third insulation layer 160.

The source electrode SE is connected to the first lower pattern 111a through a contact hole formed in the third insulation layer 160 and the buffer layer 120. In addition, the source electrode SE is connected to the source area SA of the active layer through a contact hole formed in the third insulation layer 160, and the drain electrode DE is connected to the drain area DA of the active layer through a contact hole formed in the third insulation layer 160.

The first capacitor electrode C1 and the second capacitor electrode C2 form a capacitor, in which the third insulation layer 160 is disposed therebetween.

The pad electrode PE is connected to the pad lower electrode P1 through a contact hole formed in the third insulation layer 160. In addition, the pad electrode PE is connected to the second lower pattern 111b through a contact hole formed in the third insulation layer 160 and the buffer layer 120.

A fourth insulation layer 180a is disposed on the source electrode SE, the drain electrode DE, the second capacitor electrode C2, and the pad electrode PE. The fourth insulation layer 180a includes an opening that overlaps the pad electrode PE. A protective electrode TE may be disposed in the opening. The protective electrode TE may include, for example, a transparent conductive oxide.

A fifth insulation layer 180b is disposed on the fourth insulation layer 180a. The fifth insulation layer 180b may include an opening that overlaps the protective electrode TE.

A first electrode 191 is disposed on the fifth insulation layer 180b. The first electrode 191 is connected to the source electrode SE through a contact hole formed in the fourth insulation layer 180a and the fifth insulation layer 180b.

A partition wall 350 is disposed on the first electrode 191. A second electrode 270 may overlap the first electrode 191. A light emitting element layer 370 may be disposed in an opening of the partition wall 350 between the first electrode 191 and the second electrode 270.

Referring to FIG. 2, in a pad portion of the pad area PA, the lower pattern 111b, the pad lower electrode P1, and the pad electrode PE are disposed, overlap each other, and are electrically connected to each other. Accordingly, resistance of the pad portion can be reduced.

Figure 3:
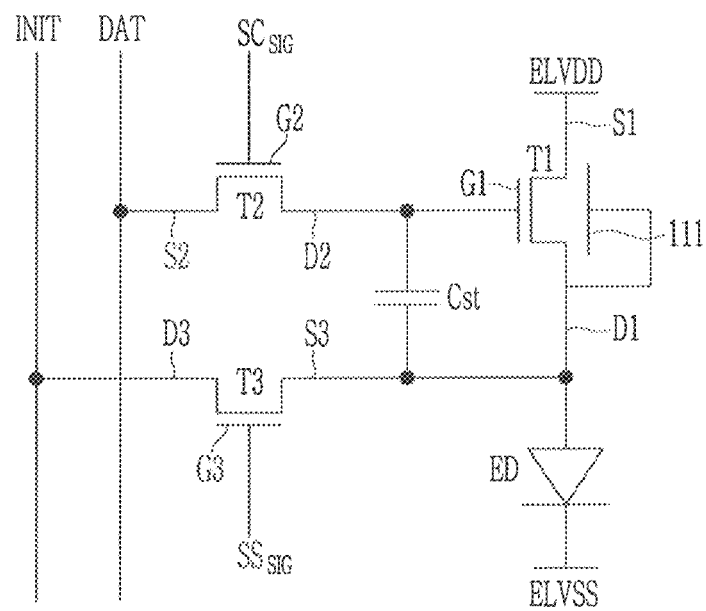
FIG. 3 is a circuit diagram of a pixel of a display device according to an exemplary embodiment of the present invention.

FIG. 3 is a circuit diagram of a pixel of a display device according to an exemplary embodiment of the present invention.

Referring to FIG. 3, a display device according to an exemplary embodiment includes a plurality of pixels. Each pixel may include a plurality of transistors T1, T2, and T3, a capacitor Cst, and at least one light emitting diode ED. An example in which each pixel includes one light emitting diode ED will be described herein.

The plurality of transistors T1, T2, and T3 include a first transistor T1, a second transistor T2, and a third transistor T3. A source electrode and a drain electrode, which will be described hereinafter, are provided for distinguishing two electrodes that are disposed at opposite sides of a channel of each of the transistors T1, T2, and T3, and the two terms may be interchangeable.

A gate electrode G1 of the first transistor T1 is connected to a first end of the capacitor Cst, a source electrode S1 of the first transistor T1 is connected to a driving voltage line that transmits a driving voltage ELVDD, and a drain electrode D1 of the first transistor T1 is connected to an anode of the light emitting diode ED and a second end of the capacitor Cst. The first transistor T1 receives a data voltage DAT according to a switching operation of the second transistor T2, and supplies a driving current to the light emitting diode ED according to a voltage stored in the capacitor Cst.

A gate electrode G2 of the second transistor T2 is connected to a first scan line SC that transmits a first scan signal $SC_{SIG}$, a source electrode S2 of the second transistor T2 is connected to a data line that may transmit the data voltage DAT or a reference voltage, and a drain electrode D2 of the second transistor T2 is connected to the first end of the capacitor Cst and the gate electrode G1 of the first transistor T1. The second transistor T2 is turned on according to the first scan signal $SC_{SIG}$, and thus transmits the reference voltage or the data voltage DAT to the gate electrode G1 of the first transistor T1 connected to the first end of the capacitor Cst.

A gate electrode G3 of the third transistor T3 is connected to a second scan line that transmits a second scan signal $SS_{SIG}$, a source electrode S3 of the third transistor T3 is connected to a second end of the capacitor Cst, the drain electrode D1 of the first transistor T1, and the anode of the light emitting diode ED, and a drain electrode D3 of the third transistor T3 is connected to an initialization voltage line that transmits an initialization voltage INIT. The third transistor T3 is turned on by the second scan signal $SS_{SIG}$, and thus transmits the initialization voltage to the anode of the light emitting diode ED and the second end of the capacitor Cst such that a voltage of the anode of the light emitting diode ED can be initialized.

The first end of the capacitor Cst is connected to the gate electrode G1 of the first transistor T1, and the second end of the capacitor Cst is connected to the source electrode S3 of the third transistor T3 and the anode of the light emitting diode ED. A cathode of the light emitting diode ED is connected to a common voltage line that transmits a common voltage ELVSS.

The light emitting diode ED may emit light according to a driving current formed by the first transistor T1.

An operation example of the circuit shown in FIG. 3, for example, when the circuit is operating during one frame, will now be described. Here, the transistors T1, T2, and T3 will be exemplarily described as N-type channel transistors. However, the transistors T1, T2, and T3 are not limited thereto.

When one frame starts, a high-level first scan signal $SC_{SIG}$ and a high-level second scan signal $SS_{SIG}$ are supplied. As a result, the second transistor T2 and the third transistor T3 are turned on in an initialization period. The reference voltage from the data line is supplied to the gate electrode G1 of the first transistor T1 and the first end of the capacitor Cst through the turned-on second transistor T2, and the initialization voltage INIT is supplied to the drain electrode D1 of the first transistor T1 and the anode of the light emitting diode ED through the turned-on third transistor T3. Accordingly, during the initialization period, the drain electrode D1 of the first transistor T1 and the anode of the light emitting diode ED are initialized with the initialization voltage INIT. In this case, a difference between the reference voltage and the initialization voltage INIT is stored in the capacitor Cst.

Next, when the second scan signal $SS_{SIG}$ becomes low level while the high-level first scan signal $SC_{SIG}$ is maintained during a sensing period, the second transistor T2 maintains the turn-on state and the third transistor T3 is turned off. The gate electrode G1 of the first transistor T1 and the first end of the capacitor Cst maintain the reference voltage through the turned-on second transistor T2, and the drain electrode D1 of the first transistor T1 and the anode of the light emitting diode ED are disconnected from the initialization voltage INIT through the turned-off third transistor T3. Accordingly, the first transistor T1 is turned off when a voltage of the drain electrode D1 becomes "a reference voltage-Vth" while a current flows to the drain electrode D1 from the source electrode S1. Here, Vth denotes a threshold voltage of the first transistor T1. In this case, a voltage difference between the gate electrode G1 and the drain electrode D1 of the first transistor T1 is stored in the capacitor Cst, and sensing of the threshold voltage Vth of the first transistor T1 is finished. Since a data signal that is compensated by reflecting sensed characteristic information is generated during every sensing period, a characteristic deviation of the transistor T1, which may be different for each pixel, may be externally compensated.

Next, when a high-level first scan signal $SC_{SIG}$ and a low-level second scan signal $SS_{SIG}$ are supplied during a data input period, the second transistor T2 is turned on and the third transistor T3 is turned off. The data voltage DAT from the data line is supplied to the gate electrode G1 of the first transistor T1 and the first end of the capacitor Cst through the turned-on second transistor T2. In this case, the drain electrode D1 of the first transistor T1 and the anode of the light emitting diode ED can maintain their potentials in the sensing period as a result of the first transistor T1, which is in the turned-off state.

Next, the first transistor T1 is turned on by the data voltage DAT transmitted to the gate electrode G1, a driving current is generated according to the data voltage DAT in a light emission period, and the light emitting diode ED emits light as a result of the driving current.

Next, a display device according to an exemplary embodiment of the present invention will be described in more detail with reference to detailed plane layout views and cross-sectional views.

Figure 4:
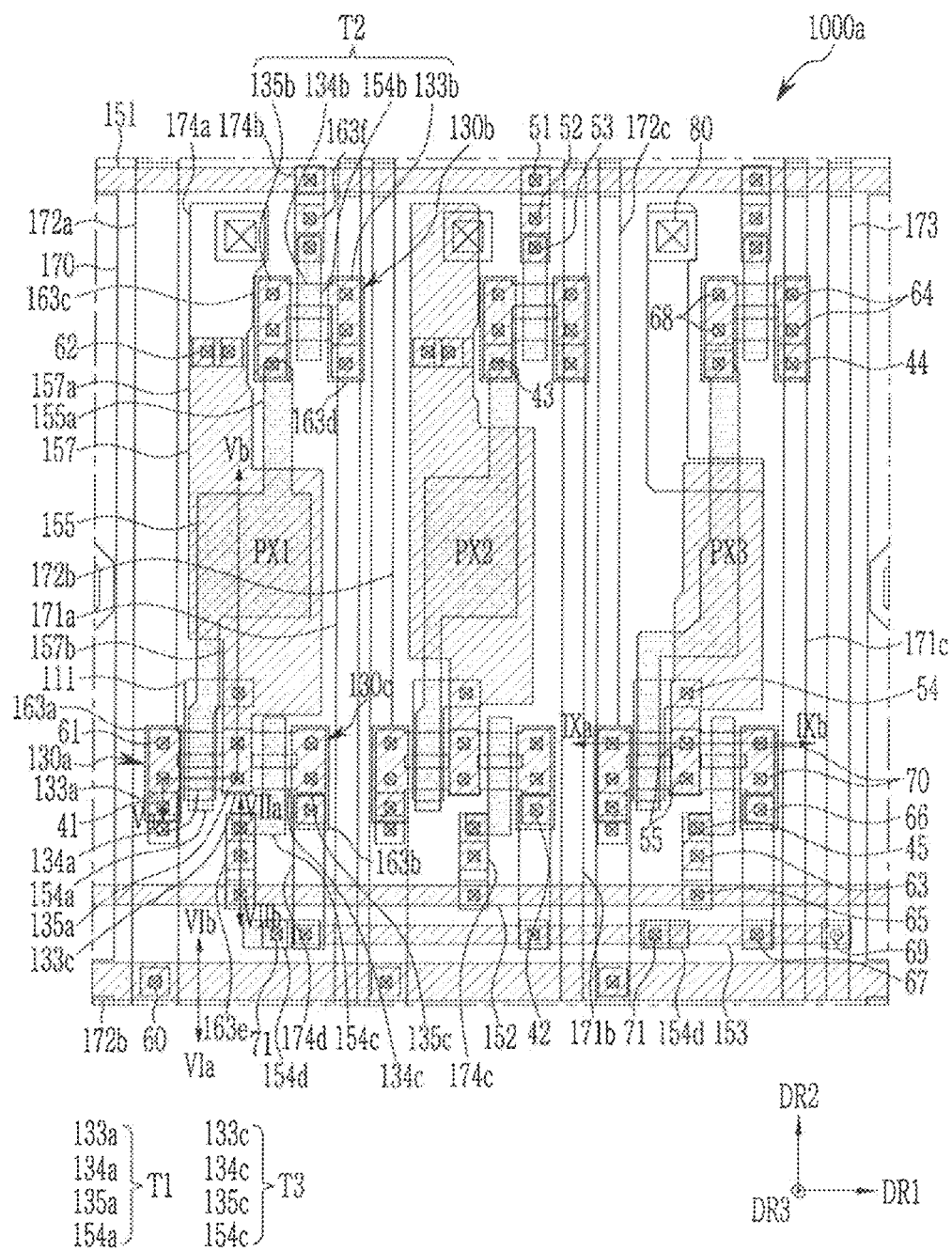
FIG. 4 is a planar layout view of a plurality of pixels of a display device according to an exemplary embodiment of the present invention.
Figure 5:
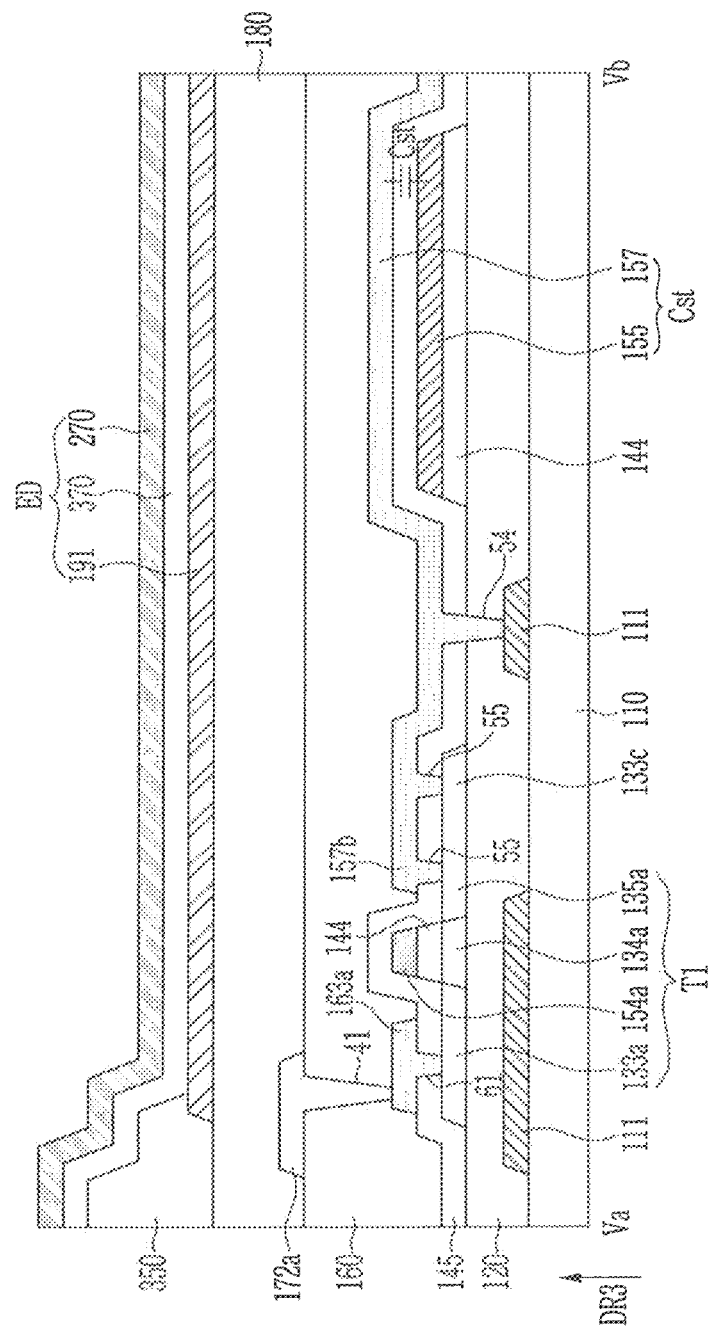
FIG. 5 is a cross-sectional view of the display device of FIG. 4 taken along line Va-Vb according to an exemplary embodiment of the present invention.
Figure 6:
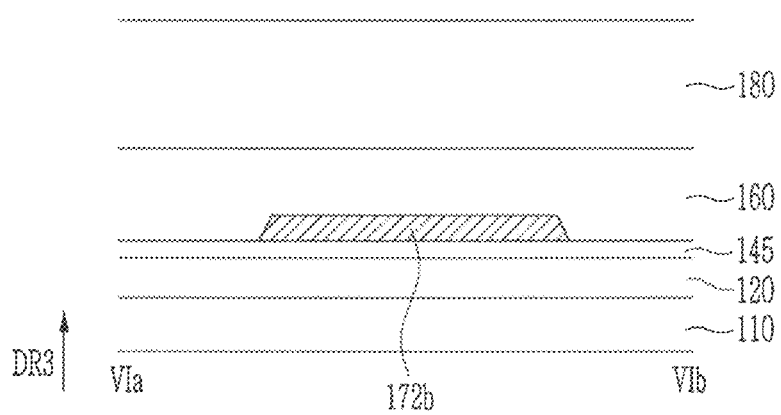
FIG. 6 is a cross-sectional view of the display device of FIG. 4 taken along line VIa-VIb according to an exemplary embodiment of the present invention.
Figure 7:
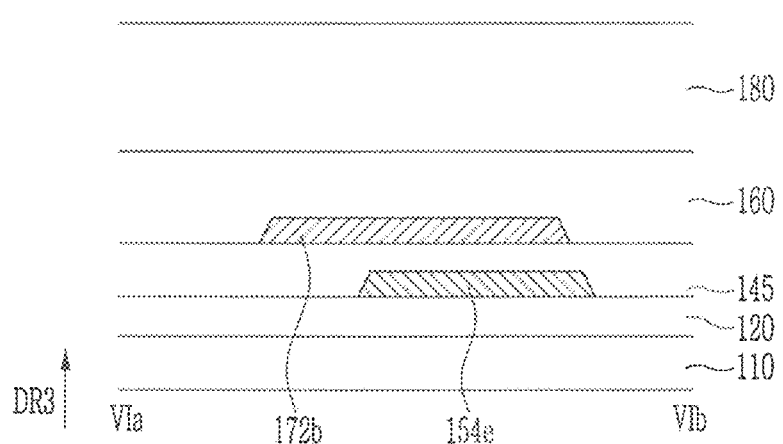
FIG. 7 is a cross-sectional view of the display device of FIG. 4 taken along line VIa-VIb according to an exemplary embodiment of the present invention.
Figure 9:
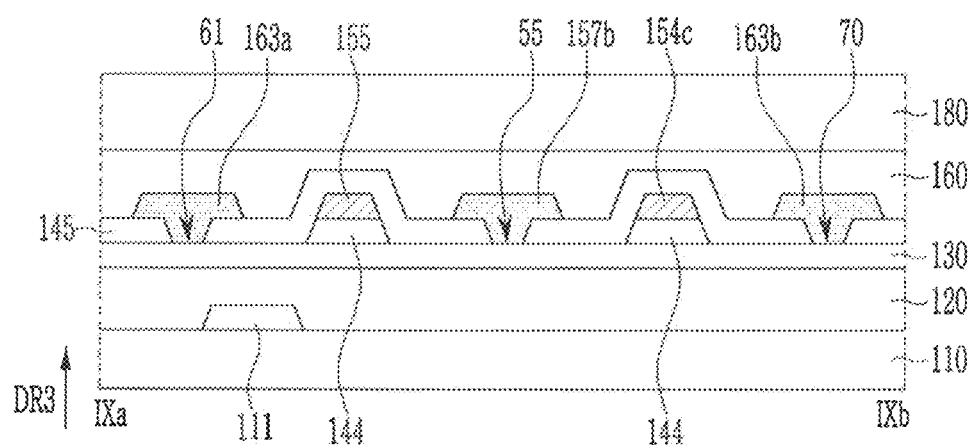
FIG. 9 is a cross-sectional view of the display device of FIG. 4 taken along line IXa-IXb according to an exemplary embodiment of the present invention.

FIG. 4 is a planar layout view of a plurality of pixels PX1, PX2, and PX3 of a display device 1000a according to an exemplary embodiment of the present invention. FIG. 5 is a cross-sectional view of the display device of FIG. 4 taken along line Va-Vb according to an exemplary embodiment of the present invention. FIG. 6 is a cross-sectional view of the display device of FIG. 4 taken along line VIa-VIb according to an exemplary embodiment of the present invention. FIG. 7 is a cross-sectional view of the display device of FIG. 4 taken along line VIa-VIb according to an exemplary embodiment of the present invention. FIG. 9 is a cross-sectional view of the display device of FIG. 4 taken along line IXa-IXb according to an exemplary embodiment of the present invention. For convenience of explanation, a further description of elements and technical aspects previously described may be omitted herein.

The display device 1000a according to an exemplary embodiment may include a substrate 110. The substrate 110 may include an insulation material such as, for example, glass, plastic, etc. The substrate 110 may be, for example, a flexible substrate.

A barrier layer, which is an insulation layer, may be disposed on the substrate 110, and a lower pattern 111 is disposed on the barrier layer as a first conductive layer. That is, the lower pattern 111 may also be referred to herein as a first conductive layer. The lower pattern 111 has conductivity, and may include various conductive metals or a semiconductor material having a conductive characteristic that is similar to the conductive metal.

A buffer layer 120, which is an insulation layer, is disposed on the lower pattern 111. That is, the lower pattern 111 may be disposed between the substrate 110 and the buffer layer 120.

An active layer that includes a plurality of active patterns 130a, 130b, and 130c is disposed on the buffer layer 120. That is, the lower pattern 111 may be disposed between the substrate 110 and the active layer. The active patterns 130a, 130b, 130c that are disposed on the first pixel PX1, the second pixel PX2, and the third pixel PX3 may include channel regions 134a, 134b, and 134c that form channels of the above-described plurality of transistors T1, T2, and T3, and a conductive area connected to the channel regions 134a, 134b, and 134c. The conductive region of the active patterns 130a, 130b, and 130c may include source regions 133a, 133b, and 133c and drain region 135a, 135b, and 135c of the respective transistors T1, T2, and T3. In each of the pixels PX1, PX2, and PX3, the first active pattern 130a and the third active pattern 130c may be connected to each other.

The active layer may include a semiconductor material such as, for example, amorphous silicon, polysilicon, or an oxide semiconductor.

An insulation pattern 144, which is a first insulation layer, is disposed on the active layer. For example, the insulation pattern 144 may be disposed on the channel regions 134a, 134b, and 134c while overlapping the channel regions 134a, 134b, and 134c of the active patterns 130a, 130b, and 130c. In an exemplary embodiment, the insulation pattern 144 does not overlap the conductive regions of the active patterns 130a, 130b, and 130c.

A second conductive layer may be disposed on the insulation pattern 144. The second conductive layer may include, for example, a driving gate electrode 155 that includes a first gate electrode 154a, a second gate electrode 154b, a third gate electrode 154c, and a gate pattern 154d.

The second conductive layer may be, for example, a double layer of molybdenum and titanium. For example, in the second conductive layer, a thickness of molybdenum may be between about 2000 Å and about 3000 Å, and a thickness of titanium may be between about 200 Å and about 400 Å.

The driving gate electrode 155 may include an extension portion 155a that protrudes upward and extends substantially in a second direction DR2, and a first gate electrode 154a that protrudes downward and extends substantially in the second direction DR2. The driving gate electrode 155 may occupy a smaller area in the third pixel PX3 than other driving gate electrodes 155 disposed in the other pixels PX1 and PX2. For example, in an exemplary embodiment, the driving gate electrode 155 disposed in the third pixel PX3 is smaller than the driving gate electrode 155 disposed in the first and second pixels PX1 and PX2.

The first gate electrode 154a overlaps the channel region 134a of the active pattern 130a while crossing the first active pattern 130a. The second gate electrode 154b overlaps the channel region 134b of the second active pattern 130b while crossing the active pattern 130b. The third gate electrode 154c overlaps the channel region 134c of the third active pattern 130c while crossing the third active pattern 130c. The gate pattern 154d may be electrically connected to an initialization voltage line 153 through a contact hole 71.

A second insulation layer 145 is disposed on the second conductive layer.

Next, a third conductive layer is disposed on the second insulation layer 145. The third conductive layer includes a first scan line 151 that transmits the above-described first scan signal $SC_{SIG}$, a second scan line 152 that transmits the second scan signal $SS_{SIG}$, a horizontal initialization voltage line 153 that transmits the initialization voltage INIT, a horizontal driving voltage line 172b that transmits the driving voltage ELVDD, a capacitor electrode 157, and a plurality of connection electrodes 163a, 163b, 163c, 163d, 163e, and 163f.

The first and second scan lines 151 and 152, the horizontal initialization voltage line 153, and the horizontal driving voltage line 172b may respectively extend in a first direction DR1. The capacitor electrode 157 may be disposed between the first scan line 151 and the second scan line 152.

The second gate electrode 154b is connected to the connection electrode 163f through a contact hole 53. The second gate electrode 154b is connected to the first scan line 151 through the connection electrode 163f. The third gate electrode 154c is connected to the connection electrode 163e through a contact hole 45, and is connected to the second scan line 152 through the connection electrode 163e. The second gate electrode 154b and the third gate electrode 154c may be island-type electrodes.

The capacitor electrode 157 disposed in each of the pixels PX1, PX2, and PX3 may include a first extension portion 157a that protrudes upward and thus substantially extends in the second direction DR2, and a second extension portion 157b that protrudes downward and thus substantially extends in the second direction DR2.

The second extension portion 157b of the capacitor electrode 157 is connected to the lower pattern 111 through a contact hole 54. In addition, end portions of the second extension portion 157b are connected to the active patterns 130a and 130b through at least one contact hole 55.

The first connection electrode 163a is connected to the driving voltage line 172a through at least one contact hole 41. The second connection electrode 163b is connected to a connection pattern 174d through at least one contact hole 42. The third connection electrode 163c is connected to the driving gate electrode 155 through a contact hole 43. The fourth connection electrode 163d is connected to the data line 171a through a contact hole 44. The fifth connection electrode 163e is connected to the third gate electrode 154c through the contact hole 45, and another portion of the fifth connection electrode 163e is connected to a connection pattern 174c through a contact hole 63.

The third connection electrode 163c is connected to the active pattern 130b through at least one contact hole 68. The second connection electrode 163b is connected to the active pattern 130c through at least one contact hole 70.

The third conductive layer may be a triple layer including, for example, titanium/aluminum/titanium. In the third conductive layer, a thickness of the titanium may be between about 400 Å and about 800 Å, and a thickness of the aluminum may be between about 5000 Å and about 7000 Å.

A third insulation layer 160 may be disposed on the third conductive layer.

The third insulation layer 160 may be, for example, an inorganic layer or an organic layer. When the third insulation layer 160 is an organic layer, a step difference due to the second conductive layer and the third conductive layer can be compensated and planarized. Accordingly, a parasitic capacitance between the third conductive layer and a fourth conductive layer (to be described later) can be reduced.

The fourth conductive layer may be disposed on the third insulation layer 160. The fourth conductive layer includes a plurality of data lines 171a, 171b, and 171c, a plurality of driving voltage lines 172a, 172b, and 172c, a common voltage line 170, an initialization voltage line 173, and a plurality of connection patterns 174a, 174b, 174c, and 174d.

The data lines 171a, 171b, and 171c, the driving voltage lines 172a, 172b, and 172c, the common voltage line 170, and the initialization voltage line 173 respectively extend substantially in the second direction DR2, and thus may cross the first scan line 151 and/or the second scan line 152.

A group of repeated pixels PX1, PX2, and PX3 shown in FIG. 4 may be arranged in the first direction DR1 and adjacent to each other. The common voltage line 170 may be disposed at the left and right sides of the group of pixels PX1, PX2, and PX3. For example, one common voltage line 170 may be disposed for each of a plurality of pixels PX1, PX2, and PX3 that are repeated. When a repeated group of a plurality of pixels PX1, PX2, and PX3 includes three pixels PX1, PX2, and PX3, three data lines 171a, 171b, and 171c, three driving voltage lines 172a, 172b, and 172c, and at least one initialization voltage line 173 may be disposed between two neighboring common voltage lines 170.

Each of the data lines 171a, 171b, and 171c is electrically connected to the source region 133b of the active pattern 130b through at least one contact hole 64 of the second insulation layer 145 and the third insulation layer 160.

In FIG. 4, each of the driving voltage lines 172a, 172b, and 172c is disposed in each of the pixels PX1, PX2, and PX3, but the driving voltage line 172a may be disposed in one pixel, for example, in the pixel PX1, and driving voltage patterns that are electrically connected to the driving voltage lines may be disposed in the other pixels PX2 and PX3.

Each of the driving voltage lines 172a, 172b, and 172c is electrically connected to the source region 133a of the active pattern 130a through at least one contact hole 61 (two contact holes 61 are shown in FIG. 4) of the second insulation layer 145 and the third insulation layer 160. In addition, each of the driving voltage lines 172a, 172b, and 172c is electrically connected to the horizontal driving voltage line 172b through at least one contact hole 60 of the second insulation layer 145 and the third insulation layer 160.

Thus, the horizontal driving voltage line 172b may transmit the driving voltage ELVDD with the driving voltage lines 172a, 172b, and 172c, and in the entire display device, the driving voltage ELVDD may be transmitted in a mesh configuration along both of the first direction DR1 and the second direction DR2.

The initialization voltage line 173 is electrically connected to the horizontal initialization voltage line 153 through a contact hole 69 of the second insulation layer 145 and the third insulation layer 160. Thus, the horizontal initialization voltage line 153 may transmit the initialization voltage INIT together with the initialization voltage line 173. Accordingly, even though the initialization voltage line 173 is formed in each of the three pixels PX1, PX2, and PX3, the initialization voltage INIT can be transmitted to all of the three pixels PX1, PX2, and PX3 through the horizontal voltage line 153.

The first connection pattern 174a is connected to the capacitor electrode 157 through a contact hole 62 through the second insulation layer 145 and the third insulation layer 160. The first connection pattern 174a is connected to a first electrode through a contact hole 80.

The second connection pattern 174b connects the first scan line 151 and the connection electrode 163f to each other through a contact hole 51 and a contact hole 52. The connection electrode 163f is connected to the second gate electrode 154b through a contact hole 53.

The third connection pattern 174c is connected to the fifth connection electrode 163e through a contact hole 63, and is connected to the second scan line 152 through a contact hole 65.

The fourth connection pattern 174d is connected to the second connection electrode 163b through a contact hole 66, and is electrically connected to the initialization voltage line 153 through a contact hole 67.

The horizontal initialization voltage line 153 extends in the first direction DR1 over the three adjacent pixels PX1, PX2, and PX3, and may be disposed between two adjacent common voltage lines 170 without crossing the two common voltage lines 170. The horizontal initialization voltage line 153 may extend only to the initialization voltage line 173 while crossing neighboring three data lines 171a, 171b, and 171c.

A first electrode 191 of a pixel electrode layer may be electrically connected to the first connection pattern 174a through the contact hole 80.

Each first electrode 191 is electrically connected to the drain region 135a of the first transistor T1 via the capacitor electrode 157 and the first connection pattern 174a such that the first electrode 191 may receive a voltage from the first transistor T1.

Referring to FIG. 5, a capacitor Cst of the display device is formed between the driving gate electrode 155 and the capacitor electrode 157. A partition wall 350 is disposed on the first electrode 191. A second electrode 270 is disposed while overlapping the first electrode 191, and a light emitting element layer 370 may be disposed in an opening of the partition wall 350 between the first electrode 191 and the second electrode 270. The first electrode 191, the light emitting element layer 370, and the second electrode 270 form a light emitting element ED.

In addition, referring to FIGS. 4 and 6, scan lines such as the horizontal driving voltage line 172b are disposed on the second insulation layer 145. That is, in FIG. 4, the second conductive layer and the third conductive layer are illustrated using different patterns, and as shown in FIG. 4, the third conductive layer includes a first scan line 151 that transmits a first scan signal $SC_{SIG}$, a second scan line 152 that transmits a second scan signal $SS_{SIG}$, the horizontal initialization voltage line 153 that transmits the initialization voltage INIT, the horizontal driving voltage line 172b that transmits the driving voltage ELVDD, the capacitor electrode 157, and the plurality of connection electrodes 163a, 163b, 163c, 163d, 163e, and 163f.

In an exemplary embodiment according to FIGS. 4-7, the third conductive layer may have a lower resistance than the second conductive layer. Thus, a load of the display device can be reduced by forming wiring such as scan lines with the third conductive layer having the lower resistance.

Although it is illustrated in FIG. 4 that the lower pattern 111 is disposed only at the periphery of the first transistor TR1, exemplary embodiments are not limited thereto. For example, according to exemplary embodiments, the lower pattern 111 may overlap the common voltage line 170, or the first scan line 151 and the second scan line 152, or other elements not shown as being overlapped in FIG. 4.

FIG. 6 shows a configuration in which scan lines such as the horizontal driving voltage line 172b is formed of a single layer of the third conductive layer. However, exemplary embodiments are not limited thereto. For example, according to exemplary embodiments, a scan line may have a stacked structure (e.g., in a third direction DR3) of the second conductive layer and the third conductive layer.

Referring to FIG. 7, a second conductive layer may further include an overlapped gate pattern 154e, and the overlapped gate pattern 154e and a horizontal driving voltage line 172b may overlap each other. The overlapped gate pattern 154e and the horizontal driving voltage line 172b may be electrically connected to each other. In this case, resistance of the horizontal driving voltage line 172b can be further reduced.

FIG. 7 has been described with reference to the horizontal driving voltage line 172b. According to exemplary embodiments, the first scan line 151, the second scan line 152, and the horizontal initialization voltage line 153 may also have a structure in which a second conductive layer and a third conductive layer are stacked.

Figure 8:
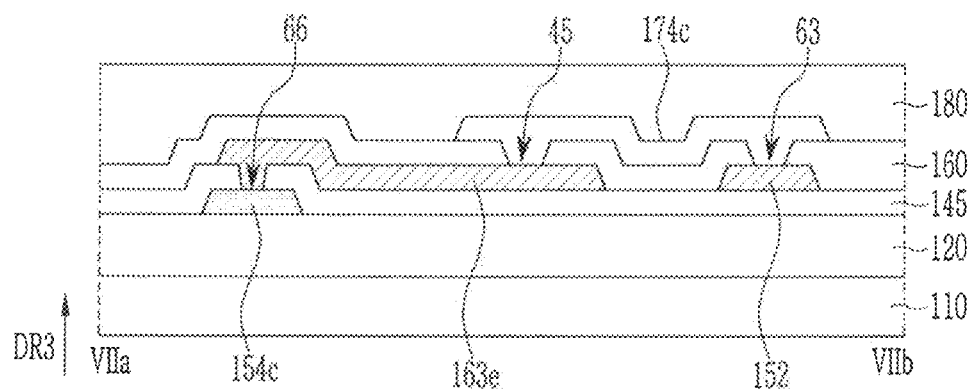
FIG. 8 is a cross-sectional view of the display device of FIG. 4 taken along line VIIa-VIIb according to an exemplary embodiment of the present invention.

Referring to FIG. 8, a voltage of a second scan line 152 is transmitted to a third connection pattern 174c through a contact hole 63, transmitted to a fifth connection electrode 163e through a contact hole 45, and then transmitted to a third gate electrode 154c through a contact hole 66.

Referring to FIG. 9, a first connection electrode 163a, a second extension portion 157b of a capacitor electrode 157, and a second connection electrode 163b are connected to an active layer 130 respectively through contact holes 61, 55, and 70.

Hereinafter, a display device according to an exemplary embodiment of the present invention will be described with reference to FIG. 10.

Figure 10:
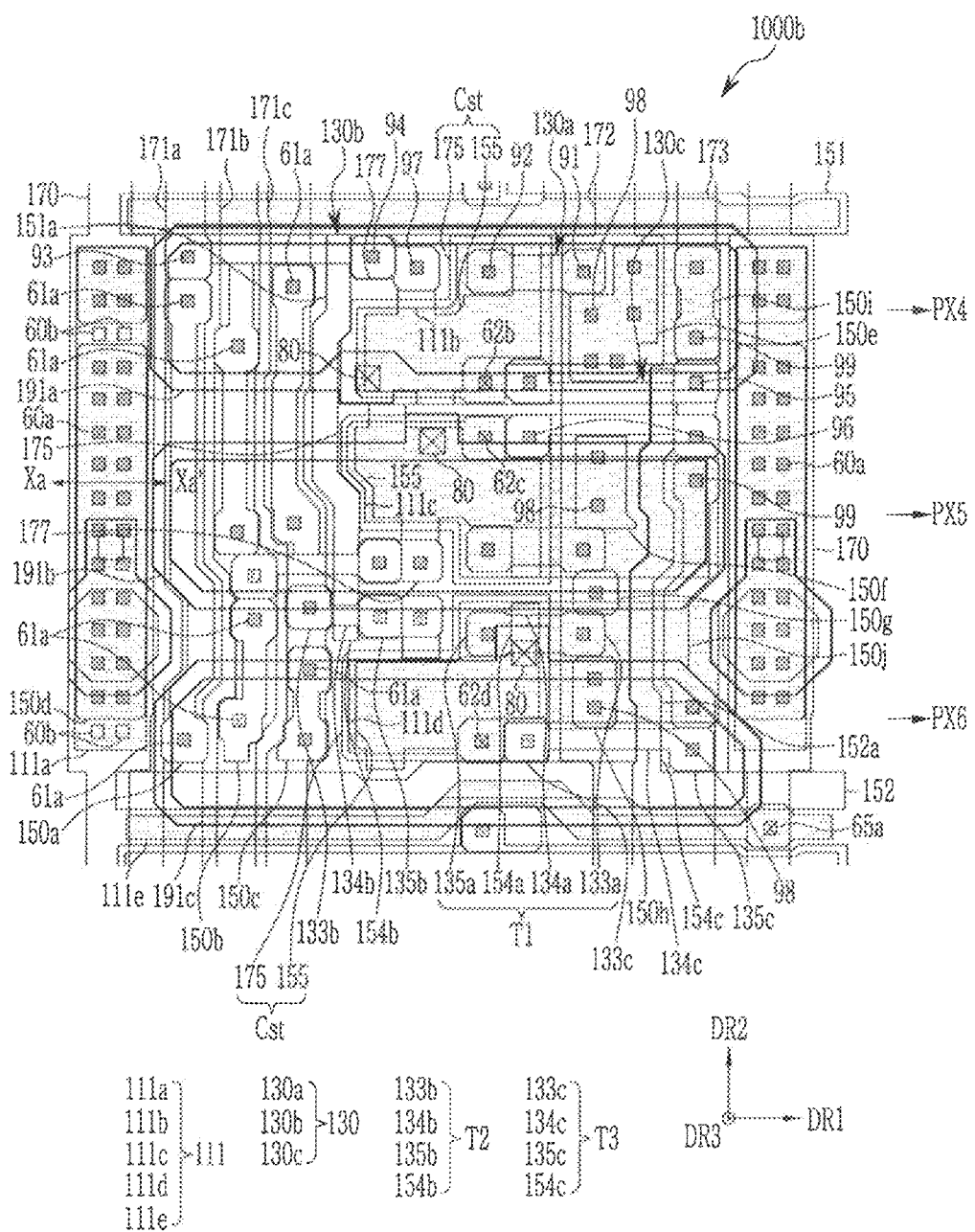
FIG. 10 is a layout view of a display device according to an exemplary embodiment of the present invention.
Figure 11:
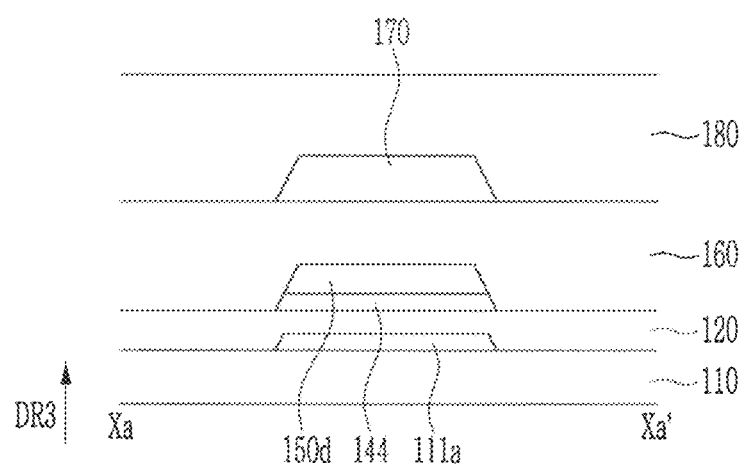
FIG. 11 is a cross-sectional view of the display device of FIG. 10 taken along line Xa-Xa' according to an exemplary embodiment of the present invention.

FIG. 10 is a layout view of a display device 1000b according to an exemplary embodiment of the present invention. FIG. 11 is a cross-sectional view of the display device of FIG. 10 taken along line Xa-Xa' according to an exemplary embodiment of the present invention.

The display device 1000b according to an exemplary embodiment of FIG. 10 is substantially the same as the display device 1000a according to an exemplary embodiment of FIG. 4 with regards to connection relationships between constituent elements and a layered structure, however, a detailed shape of each of the constituent elements and a connection method may be different. For convenience of illustration, a further description of elements and technical aspects previously described may be omitted herein, and the description may focus primarily on the differences between FIGS. 4 and 10.

A repeated group of a plurality of pixels PX4, PX5, and PX6 may be arranged adjacent to each other in a second direction DR2.

One array of pixels PX4, PX5, and PX6 may be disposed between two neighboring common voltage lines 170, and a plurality of data lines 171a, 171b, and 171c may be disposed between the array of pixels PX4, PX5, and PX6 and one common voltage line 170. In addition, a driving voltage line 172 and an initialization voltage line 173 may be disposed between the array of pixels PX4, PX5, and PX6 and the other common voltage line 170. That is, the plurality of data lines 171a, 171b, and 171c may be disposed at one side, the driving voltage line 172 and the initialization voltage line 173 may be disposed at the other side, and the array of pixels PX4, PX5, and PX6 may be disposed therebetween. A capacitor electrode 175 and a connection member 177 may be disposed on the same layer as the data lines 171a, 171b, and 171c, the driving voltage line 172, and the initialization voltage line 173.

A first scan line 151 and a second scan line 152 may be respectively disposed above and below a group of the plurality of adjacent pixels PX4, PX5, and PX6. A first data overlapped line 150a, a second data overlapped line 150b, a third data overlapped line 150c, and a common voltage overlapped line 150d may be disposed on the same layer where the first scan line 151 and the second scan line 152 are disposed. In addition, a driving gate electrode 155 may be disposed on the same layer. In addition, a plurality of gate patterns 150e, 150f, 150g, 150h, 150i, and 150j may overlap the driving voltage line 172 and the initialization voltage line 173. Each of the gate patterns 150e, 150f, 150g, 150h, 150i, and 150j is electrically connected to the driving voltage line 172 and the initialization voltage line 173 through a plurality of contact holes 98 and 99. Accordingly, the resistance of the driving voltage line 172 and the resistance of the initialization voltage line 173 can be reduced.

A part of the first scan line 151 includes a protrusion portion 151a that extends in the second direction DR2. A part of the second scan line 152 includes a protrusion portion 152a that extends in the second direction DR2.

The first data overlapped line 150a, the second data overlapped line 150b, the third data overlapped line 150c, and the common voltage overlapped line 150d respectively overlap the plurality of data lines 171a, 171b, and 171c and the common voltage line 170. The first data overlapped line 150a, the second data overlapped line 150b, and the third data overlapped line 150c are connected to the respective data lines 171a, 171b, and 171c through a plurality of contact holes 61a. In addition, the common voltage overlapped line 150d is connected to the common voltage line 171 through a plurality of contact holes 60a.

The first data overlapped line 150a, the second data overlapped line 150b, the third data overlapped line 150c, and the common voltage overlapped line 150d are electrically connected to the respective data lines 171a, 171b, and 171c and the common voltage line 170 through the plurality of contact holes 60a and 61a, thereby reducing the resistance thereof.

A lower pattern 111 includes a plurality of lower patterns 111a, 111b, 111c, 111d, and 111e. The lower pattern 111 may include, for example, TiCu. As described above, the lower pattern 111 corresponds to the first conductive layer 111.

The first lower pattern 111a overlaps the common voltage line 170, and is connected to the common voltage line 170 through a plurality of contact holes 60b.

In addition, the second lower pattern 111b, the third lower pattern 111c, and the fourth lower pattern 111d are respectively disposed in the pixels PX1, PX2, and PX3, and connected to the capacitor electrode 175 through contact holes 62b, 62c, and 62d, respectively. A fifth lower pattern 111 is connected to the common voltage line 170 through a contact hole 65a.

The driving gate electrode 155 and the capacitor electrode 175 form a capacitor.

An active layer 130 includes a first active layer 130a, a second active layer 130b, and a third active layer 130c.

The first active layer 130a is connected to the driving voltage line 172 through a contact hole 91. In addition, another side of the first active layer 130a is connected to the capacitor electrode 175 through a contact hole 92.

A source region 133a, a channel region 134a, and a drain region 135a of the first active layer 130a form a first transistor T1 together with a first gate electrode 154a, which is a part of the driving gate electrode 155.

The second active layer 130b is connected to the respective data lines 171a, 171b, and 171c through a contact hole 93. Another side of the second active layer 130b is connected to a connection member 177 through a contact hole 94.

A source region 133b, a channel region 134b, and a drain region 135b of the second active layer 130b form a second transistor T2 together with a second gate electrode 154b, which is a part of the protrusion portion 151a of the first scan line 151.

The third active layer 130c is connected to the initialization voltage line 173 through a contact hole 95. Another side of the third active layer 130c is connected to the capacitor electrode 175 through a contact hole 96.

A source region 133c, a channel region 134c, and a drain region 135c of the third active layer 130c form a third transistor T3 together with a third gate electrode 154c, which is a part of the protrusion portion 152a of the second scan line 152.

The connecting member 177 is connected to the second active layer 130b through the contact hole 94, and is connected to the driving gate electrode 155 through another contact hole 97.

First electrodes 191a, 191b, and 191c of the respective pixels PX4, PX5, and PX6 are electrically connected to the capacitor electrode 175 through a contact hole 80.

Referring to FIG. 10, each common voltage line 170 and first scan line 151 may be electrically connected to the lower pattern 111 while being overlapped with the lower pattern 111. The lower pattern 111 may include, for example, TiCu. Accordingly, the resistance of the common voltage line 170 and the resistance of the first scan line 151 can be reduced.

In addition, the first data overlapped line 150a, the second data overlapped line 150b, the third data overlapped line 150c, and the plurality of gate patterns 150e, 150f, 150g, 150h, 150i, and 150j are also disposed below the data lines 171a, 171b, and 171c, the driving voltage line 172, and the initialization voltage line 173, while overlapping the same and while being electrically connected to each other. In this case, the resistance of the data lines 171a, 171b, and 171c, the resistance of the driving voltage line 172, and the resistance of the initialization voltage line 173 can be reduced.

FIG. 11 is a cross-sectional view of FIG. 10 taken along line Xa-Xa' according to an exemplary embodiment of the present invention. Referring to FIG. 11, the common voltage line 170 overlaps the first lower pattern 111a, a gate insulation layer 144, and the common voltage overlapped line 150d. Each layer is connected to each other through a contact hole. Therefore, the resistance of the common voltage line 170 may be reduced.

As described above, the display device according to exemplary embodiments forms a capacitor by using a second conductive layer and a third conductive layer, the scan line is disposed in the same layer as the third conductive layer, and a gate electrode of the transistor includes a multiple gate electrode that includes the second conductive layer and the third conductive layer. As a result, a load of the display device can be reduced. In this case, resistance of the third conductive layer may be lower than that of the second conductive layer.

In addition, the display device according to exemplary embodiments can reduce the resistance by forming the common voltage line, the data line, and the like in a structure in which the common line and the data line overlap with the same layer and the lower pattern and are electrically connected to each other. Likewise, the driving voltage line and the initialization voltage line can be formed in an electrically connected structure by overlapping the scan line and the same layer to reduce the resistance.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A display device, comprising:
    a substrate;
    a first conductive layer disposed on the substrate;
    a first insulation layer disposed on the first conductive layer;
    a plurality of active patterns disposed on the first insulation layer, and comprising a source region, a channel region, and a drain region;
    a second conductive layer disposed on the active patterns, and comprising a first gate electrode that overlaps the channel region and a driving gate electrode,
    wherein the active patterns are disposed in a layer located between the substrate and the first gate electrode and located between the substrate and the driving gate electrode;
    a second insulation layer disposed on the second conductive layer;
    a third conductive layer comprising a capacitor electrode and at least one scan line disposed on the second insulation layer;
    a third insulation layer disposed on the third conductive layer; and
    an electrode layer comprising a first electrode disposed on the third insulation layer,
    wherein the first electrode is connected to the capacitor electrode, and
    the capacitor electrode overlaps the driving gate electrode, and the capacitor electrode and the driving gate electrode form a capacitor.

2. The display device of claim 1, wherein the capacitor electrode is electrically connected to the first conductive layer.

3. The display device of claim 1, wherein the second conductive layer further comprises an overlapped gate pattern that overlaps the at least one scan line.

4. The display device of claim 1, wherein the third insulation layer comprises an organic material.

5. The display device of claim 1, further comprising:
    a fourth conductive layer disposed between the third insulation layer and the electrode layer,
    wherein the fourth conductive layer comprises a data line, a driving voltage line, a common voltage line, an initialization voltage line, and a plurality of connection patterns.

6. The display device of claim 5, wherein the at least one scan line comprises a first scan line and a second scan line,
    the second conductive layer further comprises a second gate electrode, and
    the first scan line and the second gate electrode are connected to each other by one connection pattern from among the plurality of connection patterns.

7. The display device of claim 5, wherein the first electrode and the capacitor electrode are connected to each other through one of the plurality of connection patterns.

8. The display device of claim 1, wherein the third conductive layer further comprises a plurality of connection electrodes,
    the plurality of active patterns comprise a first active pattern, a second active pattern, and a third active pattern, and
    each active pattern is connected to at least one of the plurality of connection electrodes of the third conductive layer.

9. The display device of claim 8, wherein a resistance of the third conductive layer is lower than a resistance of the second conductive layer.

10. A display device, comprising:
    a substrate;
    a first conductive layer disposed on the substrate;
    a first insulation layer disposed on the first conductive layer;
    a plurality of active patterns disposed on the first insulation layer, and comprising a source region, a channel region, and a drain region;
    a second conductive layer disposed on the active patterns, and comprising a plurality of data overlapped lines, a first gate electrode, and a driving gate electrode,
    wherein the active patterns are disposed in a layer located between the substrate and the first gate electrode and located between the substrate and the driving gate electrode;
    a second insulation layer disposed on the second conductive layer;
    a third conductive layer disposed on the second insulation layer, and comprising a plurality of data lines, a common voltage line and at least one scan line;
    a third insulation layer disposed on the third conductive layer; and
    an electrode layer comprising a first electrode disposed on the third insulation layer,
    wherein the plurality of data lines overlap the plurality of data overlapped lines, respectively.

11. The display device of claim 10, wherein the second conductive layer further comprises a common voltage overlapped line,
    the common voltage line overlaps the common voltage overlapped line and the first conductive layer, and
    the common voltage line is electrically connected to the common voltage overlapped line and the first conductive layer.

12. The display device of claim 10, wherein the third conductive layer further comprises a driving voltage line and an initialization voltage line,
    the second conductive layer comprises a plurality of gate patterns, and
    the plurality of gate patterns, the driving voltage line, and the initialization voltage line respectively overlap each other.

13. The display device of claim 10, wherein the first conductive layer comprises a plurality of lower patterns, and
    one of the plurality of lower patterns is disposed in a direction that crosses the common voltage line and is connected to the common voltage line.

14. The display device of claim 10, wherein the plurality of active patterns comprise a first active pattern, a second active pattern, and a third active pattern,
    the at least one scan line comprises a first scan line and a second scan line,
    an extending portion of the first scan line extends in a direction that is different from a remaining portion of the first scan line, and
    the extending portion of the first scan line overlaps the channel regions of the first active pattern and the third active pattern.

15. The display device of claim 14, wherein an extending portion of the second scan line extends in a direction that is different from a remaining portion of the second scan line, and the extending portion of the second scan line overlaps the channel region of the second active pattern.

16. The display device of claim 10, further comprising:

a pad electrode disposed on a same layer as the third conductive layer; and a pad connection electrode disposed on a same layer as the second conductive layer, wherein the pad electrode is electrically connected to the first conductive layer, and the pad electrode is electrically connected to the pad connection electrode.

17. The display device of claim 10, wherein the third conductive layer further comprises a capacitor that overlaps the driving gate electrode.

18. The display device of claim 17, wherein the first conductive layer comprises a plurality of lower patterns, and at least one of the plurality of lower patterns overlaps the capacitor electrode.

19. The display device of claim 17, further comprising:

a first electrode connected to the capacitor electrode.

20. A display device, comprising:

a substrate;

a first conductive layer disposed on the substrate;

a transistor disposed on the first conductive layer, and comprising a plurality of active patterns, a gate electrode, and an overlapped gate electrode, wherein the gate electrode is formed in a second conductive layer disposed on the first conductive layer, and the overlapped gate electrode is formed in a third conductive layer disposed on the second conductive layer;

a capacitor comprising a driving gate electrode and a capacitor electrode, wherein the capacitor electrode overlaps the driving gate electrode, the capacitor electrode is formed in the third conductive layer, and the driving gate electrode is formed in the second conductive layer, wherein the active patterns are disposed in a layer located between the substrate and the gate electrode and located between the substrate and the driving gate electrode; and a scan line formed in the third conductive layer.

* * * * *